(12) United States Patent
Steele et al.

(10) Patent No.: US 8,712,339 B2
(45) Date of Patent: Apr. 29, 2014

(54) METHODS AND APPARATUS FOR POWER AMPLIFIER CALIBRATION

(75) Inventors: Gregory Steele, Santa Clara, CA (US); Michael Kohlmann, Santa Clara, CA (US); James M. Gardner, Santa Clara, CA (US)

(73) Assignee: QUALCOMM Incorporated, San Diego, CA (US)

( * ) Notice: Subject to any disclaimer, the term of this patent is extended or adjusted under 35 U.S.C. 154(b) by 283 days.

(21) Appl. No.: 13/396,435

(22) Filed: Feb. 14, 2012

(65) Prior Publication Data

US 2012/0264378 A1    Oct. 18, 2012

Related U.S. Application Data

(60) Provisional application No. 61/476,137, filed on Apr. 15, 2011.

(51) Int. Cl.
    *H04B 1/38*      (2006.01)

(52) U.S. Cl.
    USPC ........ 455/73; 455/127.2; 455/11.1; 455/13.1; 455/114.3; 455/126; 375/296

(58) Field of Classification Search
    CPC .............................. H04B 1/3883; H04M 19/08
    USPC ........... 455/73, 127.2, 11.1, 13.1, 114.3, 126; 375/296
    See application file for complete search history.

(56) References Cited

U.S. PATENT DOCUMENTS

| | | | |
|---|---|---|---|
| 6,614,854 B1 | 9/2003 | Chow et al. | |
| 6,798,843 B1 * | 9/2004 | Wright et al. | 375/296 |
| 6,842,011 B1 * | 1/2005 | Page et al. | 324/637 |
| 7,515,884 B2 | 4/2009 | Blech et al. | |
| 7,519,323 B2 * | 4/2009 | Mohebbi | 455/11.1 |
| 8,055,217 B2 * | 11/2011 | Ba et al. | 455/114.3 |
| 2004/0198261 A1 | 10/2004 | Xiong | |

OTHER PUBLICATIONS

International Search Report and Written Opinion—PCT/US2012/033154—ISA/EPO—Jul. 16, 2012.

* cited by examiner

*Primary Examiner* — Sanh Phu
(74) *Attorney, Agent, or Firm* — Charles E. Eggers

(57) ABSTRACT

Systems, methods and apparatus a provided for calibrating actual output power of a transmit power sensor for closed loop power control using a quality metric such as error vector magnitude (EVM) to improve power detection accuracy. In aspects, a method for correlating an output of a transmit power sensor with actual output power of a wireless transmitter includes deriving a characteristic correlation between an actual output power of a set of transmit amplifiers and an output power and of a set of corresponding power detection circuits over a range of transmit power levels in a corresponding set of wireless devices; storing the characteristic correlation in a wireless device that is not part of the set from which the characteristic correlation was derived; and sensing an output of a transmit power sensor of the device while the transmitter of the device transmits according to one or more gain settings.

27 Claims, 12 Drawing Sheets

METHODS AND APPARATUS FOR POWER AMPLIFIER CALIBRATION

CROSS REFERENCE TO RELATED APPLICATIONS

This application claims priority under 35 U.S.C. §119(e) to U.S. Provisional Patent Application No. 61/476,137 entitled "METHODS AND APPARATUS FOR POWER AMPLIFIER CALIBRATION" filed on Apr. 15, 2011, the disclosure of which is hereby incorporated by reference in its entirety.

FIELD

The present application relates generally to wireless communications, and more specifically to systems, methods, and devices for calibrating a transmit power sensor for use in closed loop power control.

BACKGROUND

In many telecommunication systems, communications networks are used to exchange messages among several interacting spatially-separated devices. Networks may be classified according to geographic scope, which could be, for example, a metropolitan area, a local area, or a personal area. Such networks may be designated as a wide area network (WAN), metropolitan area network (MAN), local area network (LAN), wireless local area network (WLAN), or personal area network (PAN). Networks also differ according to the switching/routing technique used to interconnect the various network nodes and devices (e.g., circuit switching vs. packet switching), the type of physical media employed for transmission (e.g., wired vs. wireless), and the set of communication protocols used (e.g., Internet protocol suite, SONET (Synchronous Optical Networking), Ethernet, etc.).

The devices in a wireless network may transmit/receive information between each other using different protocols. For example, a device may transmit data packets using both an 802.11a protocol and an 802.11b protocol. Each protocol supported by the device may have different power output requirements when transmitting data packet units. Power output may be controlled to maintain emission requirements and to ensure minimal signal distortion. Accordingly, improved systems, methods, and devices for ensuring that packets are transmitted at correct power levels are desired.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the subject matter described in the disclosure provides an implementation of a method of correlating an output of a transmit power sensor with actual output power of a wireless transmitter. The method includes deriving a characteristic correlation between an actual output power of a set of transmit amplifiers and an output power and of a set of corresponding power detection circuits over a range of transmit power levels in a corresponding set of wireless communication devices. The method further includes storing the characteristic correlation in a wireless device that is not part of the set from which the characteristic correlation was derived. The method further includes sensing an output of a transmit power sensor of the wireless device while the wireless transmitter of the wireless device transmits according to one or more gain settings. The method further includes producing an estimate of actual output power based at least in part on the characteristic correlation. The method further includes adjusting gain setting data based at least in part on the estimate of actual output power.

Another aspect of the subject matter described in this disclosure provides a wireless communication apparatus. The wireless communication apparatus includes a transceiver. The wireless communication apparatus further includes a memory having stored therein a characteristic correlation between an actual output power of a set of transmit amplifiers and an output power and of a set of corresponding power detection circuits over a range of transmit power levels in a corresponding set of wireless communication devices. The wireless communication apparatus further includes processing circuitry configured to sense an output of a transmit power sensor of the transceiver while the transceiver transmits according to one or more first gain settings. The wireless communication apparatus further includes processing circuitry configured to produce an estimate of actual output power based at least in part on the characteristic correlation. The apparatus further includes processing circuitry configured to adjust gain setting data based at least in part on the estimate of actual output power.

Yet another aspect of the subject matter described in the disclosure provides an implementation of a method of correlating an output of a transmit power sensor with actual output power of a wireless transmitter. The method includes transmitting a signal with the wireless transmitter according to one or more first gain settings of one or more amplifiers in the wireless transmitter. The method further includes sensing an output of the transmit power sensor while the wireless transmitter transmits according to the one or more first gain settings. The method further includes measuring one or more signal quality characteristics of the transmitted signal at the one or more first gain settings. The method further includes deriving an estimate of actual output power at the one or more first gain settings. Deriving is based at least in part on the one or more signal quality characteristics. The method further includes storing data correlating the estimate of actual output power to the output of the transmit power sensor at the one or more first gain settings.

Another aspect of the subject matter described in the disclosure provides a transceiver apparatus. The transceiver apparatus includes one or more transmit amplifiers configured to output a signal according to one or more first gain settings. The transceiver apparatus further includes a detector configured to produce an output dependent on a transmit output power level of the one or more transmit amplifiers. The transceiver apparatus further includes processing circuitry configured to measure one or more signal quality characteristics of the signal output by the one or more transmit amplifiers. The transceiver apparatus further includes processing circuitry configured to derive an estimate of actual output power by the one or more transmit amplifiers based at least in part on the one or more signal quality characteristics. The transceiver apparatus further includes processing circuitry configured to store data correlating the estimate of actual output power with the output of the detector.

Another aspect of the subject matter described in the disclosure provides a transceiver apparatus. The transceiver apparatus includes means for transmitting a signal according to one or more first gain settings of one or more amplifiers of the means for transmitting the signal. The transceiver apparatus further includes means for sensing transmit power while the means for transmitting transmits according to the one or more first gain settings. The transceiver apparatus further includes means for measuring one or more signal quality characteristics of the transmitted signal at the one or more first gain settings. The transceiver apparatus further includes means for deriving an estimate of actual output power at the one or more first gain settings. The deriving is based at least in part on the one or more signal quality characteristics. The transceiver apparatus further includes means for storing data correlating the estimate of actual output power to the output of the transmit power sensor at the one or more first gain settings.

Figure 1:
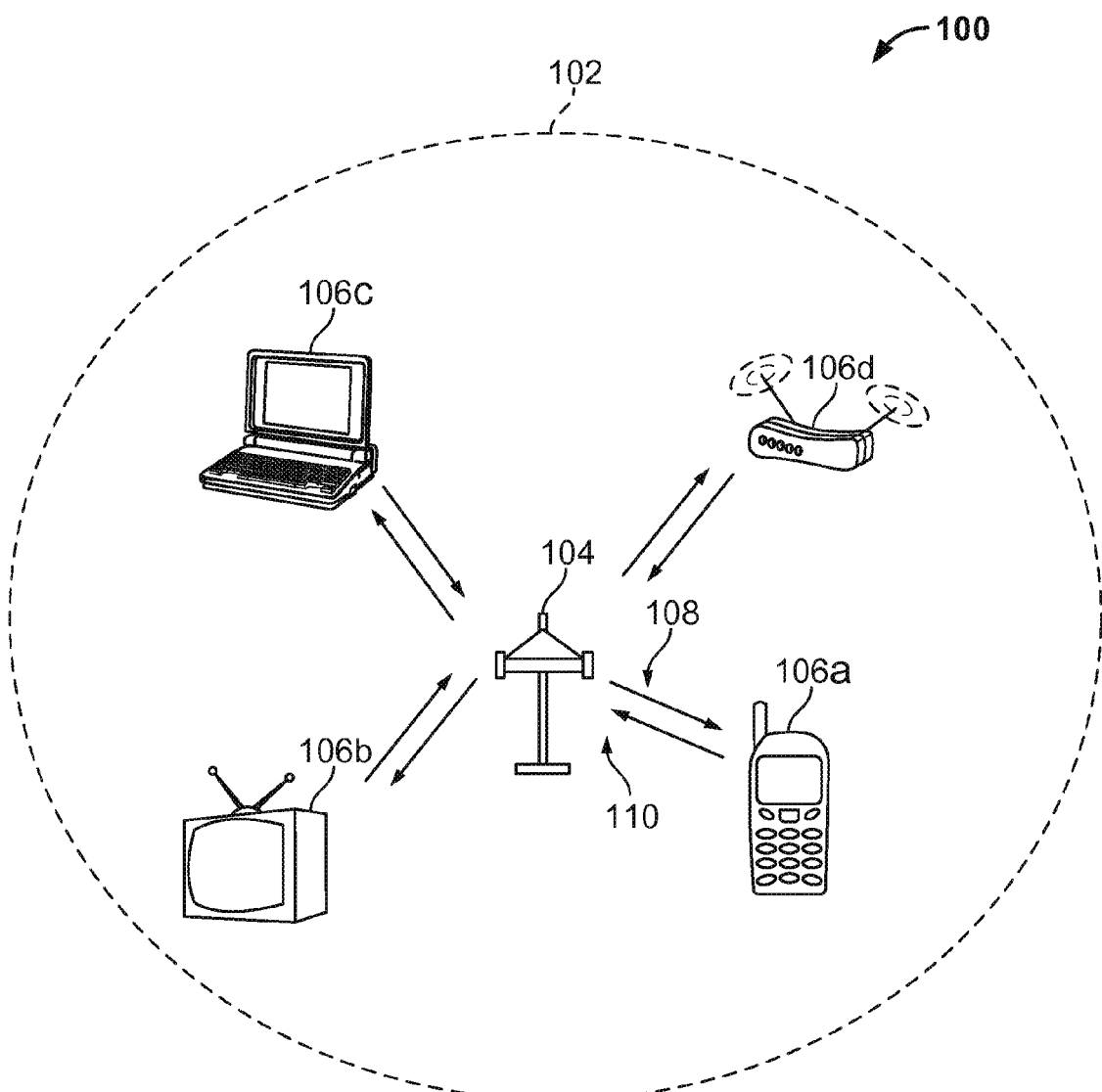
FIG. 1 illustrates an example of a wireless communication system in which aspects of the present disclosure may be employed.

The various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

Various aspects of implementations within the scope of the appended claims are described below. It should be apparent that the aspects described herein may be implemented in a wide variety of forms and that any specific structure and/or function described herein is merely illustrative. Based on the present disclosure a person/one having ordinary skill in the art should appreciate that an aspect described herein may be implemented independently of any other aspects and that two or more of these aspects may be combined in various ways. For example, an apparatus may be implemented and/or a method may be practiced using any number of the aspects set forth herein. In addition, such an apparatus may be implemented and/or such a method may be practiced using other structure and/or functionality in addition to or other than one or more of the aspects set forth herein.

The word "exemplary" is used herein to mean "serving as an example, instance, or illustration." Any implementation described herein as "exemplary" is not necessarily to be construed as preferred or advantageous over other implementations. The following description is presented to enable any person skilled in the art to make and use the invention. Details are set forth in the following description for purpose of explanation. It should be appreciated that one of ordinary skill in the art would realize that the invention may be practiced without the use of these specific details. In other instances, well known structures and processes are not elaborated in order not to obscure the description of the invention with unnecessary details. Thus, the present invention is not intended to be limited by the implementations shown, but is to be accorded with the widest scope consistent with the principles and features disclosed herein.

Wireless network technologies may include various types of wireless local area networks (WLANs). A WLAN may be used to interconnect nearby devices together, employing widely used networking protocols. The various aspects described herein may apply to any communication standard, such as WiFi or any member of the IEEE 802.11 family of wireless protocols.

In some aspects, wireless signals according to an 802.11x protocol may be transmitted using orthogonal frequency-division multiplexing (OFDM), direct-sequence spread spectrum (DSSS) communications, a combination of OFDM and DSSS communications, or other schemes. In some implementations, a WLAN includes various devices which are the components that access the wireless network. For example, there may be two types of devices: access points ("APs") and clients (also referred to as stations, or "STAs"). In general, an AP serves as a hub or base station for the WLAN and an STA serves as a user of the WLAN. For example, an STA may be a laptop computer, a personal digital assistant (PDA), a mobile phone, etc. In an example, an STA connects to an AP via a WiFi (e.g., IEEE 802.11 protocol such as 802.11ah) compliant wireless link to obtain general connectivity to the Internet or to other wide area networks. In some implementations an STA may also be used as an AP.

An access point ("AP") may also comprise, be implemented as, or known as a NodeB, Radio Network Controller ("RNC"), eNodeB, Base Station Controller ("BSC"), Base Transceiver Station ("BTS"), Base Station ("BS"), Transceiver Function ("TF"), Radio Router, Radio Transceiver, or some other terminology.

A station "STA" may also comprise, be implemented as, or known as an access terminal ("AT"), a subscriber station, a subscriber unit, a mobile station, a remote station, a remote terminal, a user terminal, a user agent, a user device, user equipment, or some other terminology. In some implementations an access terminal may comprise a cellular telephone, a cordless telephone, a Session Initiation Protocol ("SIP") phone, a wireless local loop ("WLL") station, a personal digital assistant ("PDA"), a handheld device having wireless connection capability, or some other suitable processing device connected to a wireless modem. Accordingly, one or more aspects taught herein may be incorporated into a phone (e.g., a cellular phone or smartphone), a computer (e.g., a laptop), a portable communication device, a headset, a portable computing device (e.g., a personal data assistant), an entertainment device (e.g., a music or video device, or a satellite radio), a gaming device or system, a global positioning system device, or any other suitable device that is configured to communicate via a wireless medium.

FIG. 1 illustrates an example of a wireless communication system 100 in which aspects of the present disclosure may be employed. The wireless communication system 100 may operate pursuant to a wireless standard such as one of the 802.11 family of standards. The wireless communication system 100 may include an AP 104, which communicates with STAs 106.

A variety of processes and methods may be used for transmissions in the wireless communication system 100 between the AP 104 and the STAs 106. For example, signals may be sent and received between the AP 104 and the STAs 106 in accordance with OFDM/OFDMA techniques. If this is the case, the wireless communication system 100 may be referred to as an OFDM/OFDMA system. Alternatively, signals may be sent and received between the AP 104 and the STAs 106 in accordance with CDMA techniques. If this is the case, the wireless communication system 100 may be referred to as a CDMA system.

A communication link that facilitates transmission from the AP 104 to one or more of the STAs 106 may be referred to as a downlink (DL) 108, and a communication link that facilitates transmission from one or more of the STAs 106 to the AP 104 may be referred to as an uplink (UL) 110. Alternatively, a downlink 108 may be referred to as a forward link or a forward channel, and an uplink 110 may be referred to as a reverse link or a reverse channel.

The AP 104 may act as a base station and provide wireless communication coverage in a basic service area (BSA) 102. The AP 104 along with the STAs 106 associated with the AP 104 and that use the AP 104 for communication may be referred to as a basic service set (BSS). It should be noted that the wireless communication system 100 may not have a central AP 104, but rather may function as a peer-to-peer network between the STAs 106. Accordingly, the functions of the AP 104 described herein may alternatively be performed by one or more of the STAs 106.

Figure 2:
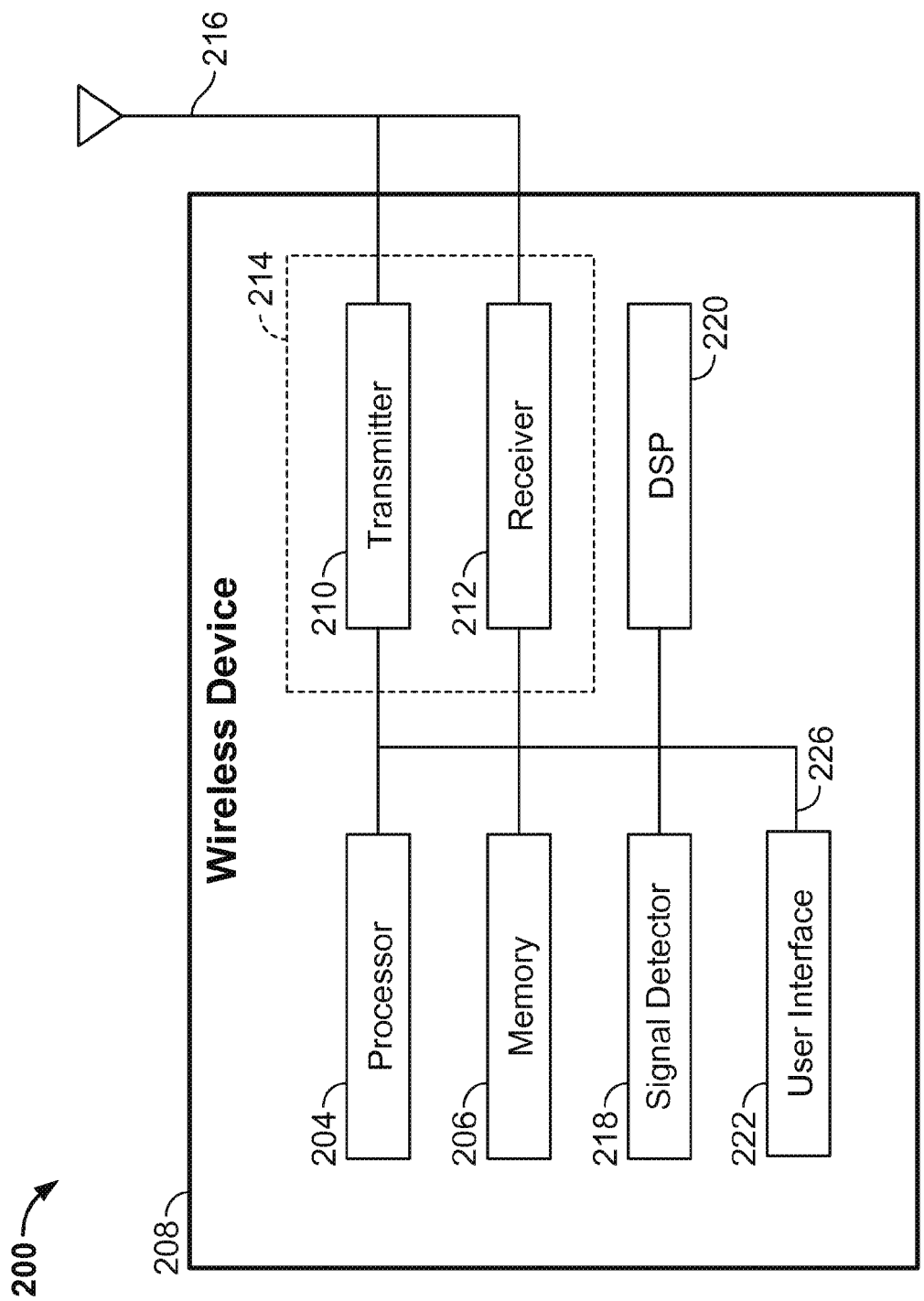
FIG. 2 shows a functional block diagram of an exemplary wireless device that may be employed within the wireless communication system of FIG. 1.

FIG. 2 illustrates various components that may be utilized in a wireless device 200 that may be employed within the wireless communication system 100. The wireless device 200 is an example of a device that may be configured to implement the various methods described herein. For example, the wireless device 200 may comprise the AP 104 or one of the STAs 106.

The wireless device 200 may include a processor 204 which controls operation of the wireless device 200. The processor 204 may also be referred to as a central processing unit (CPU). Memory 206, which may include both read-only memory (ROM) and random access memory (RAM), provides instructions and data to the processor 204. A portion of the memory 206 may also include non-volatile random access memory (NVRAM). The processor 204 typically performs logical and arithmetic operations based on program instructions stored within the memory 206. The instructions in the memory 206 may be executable to implement the methods described herein.

The processor 204 may comprise or be a component of a processing system implemented with one or more processors. The one or more processors may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that can perform calculations or other manipulations of information.

The processing system may also include machine-readable media for storing software. Software shall be construed broadly to mean any type of instructions, whether referred to as software, firmware, middleware, microcode, hardware description language, or otherwise. Instructions may include code (e.g., in source code format, binary code format, executable code format, or any other suitable format of code). The instructions, when executed by the one or more processors, cause the processing system to perform the various functions described herein.

The wireless device 200 may also include a housing 208 that may include a transmitter 210 and a receiver 212 to allow transmission and reception of data between the wireless device 200 and a remote location. The transmitter 210 and receiver 212 may be combined into a transceiver 214. An antenna 216 may be attached to the housing 208 and electrically coupled to the transceiver 214. The wireless device 200 may also include (not shown) multiple transmitters, multiple receivers, multiple transceivers, and/or multiple antennas.

The wireless device 200 may also include a signal detector 218 that may be used in an effort to detect and quantify the level of signals received by the transceiver 214. The signal detector 218 may detect such signals as total energy, energy per subcarrier per symbol, power spectral density and other signals. The wireless device 200 may also include a digital signal processor (DSP) 220 for use in processing signals. The DSP 220 may be configured to generate a data unit for transmission. In some aspects, the data unit may comprise a physical layer data unit (PPDU). In some aspects, the PPDU is referred to as a packet.

The wireless device 200 may further comprise a user interface 222 in some aspects. The user interface 222 may comprise a keypad, a microphone, a speaker, and/or a display. The user interface 222 may include any element or component that conveys information to a user of the wireless device 200 and/or receives input from the user.

The various components of the wireless device 200 may be coupled together by a bus system 226. The bus system 226 may include a data bus, for example, as well as a power bus, a control signal bus, and a status signal bus in addition to the data bus. Those of skill in the art will appreciate the components of the wireless device 200 may be coupled together or accept or provide inputs to each other using some other mechanism.

Although a number of separate components are illustrated in FIG. 2, those of skill in the art will recognize that one or more of the components may be combined or commonly implemented. For example, the processor 204 may be used to implement not only the functionality described above with respect to the processor 204, but also to implement the functionality described above with respect to the signal detector 218 and/or the DSP 220. Further, each of the components illustrated in FIG. 2 may be implemented using a plurality of separate elements.

Different protocols used for transmitting packets may have a variety of different power output requirements either defined via the media access layer (MAC) or dictated by components and requirements of the physical layer (PHY). In some cases, each packet may include information indicating a target output power level for the packet's transmission. Target output power levels may be used to for meeting emission requirements and for maintaining desired error vector magnitude (EVM) for a given data rate to minimize errors during communication.

Figure 3:
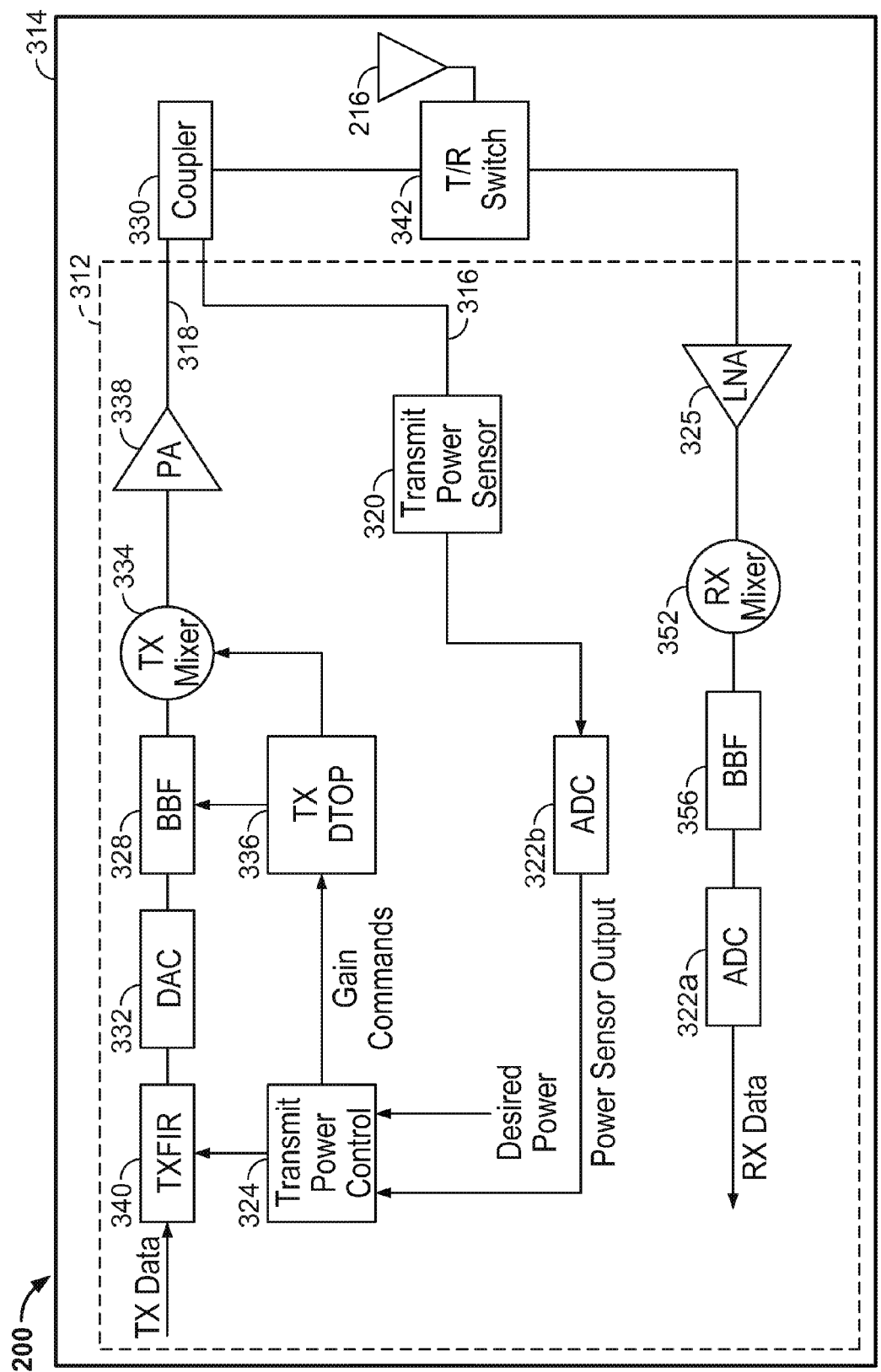
FIG. 3 shows a functional block diagram of exemplary components that may be utilized in the wireless device of FIG. 2 to transmit wireless communications at various power levels.

FIG. 3 shows a functional block diagram of exemplary components that may be utilized in the wireless device 200 of FIG. 2 to transmit wireless communications at various power levels. As shown in FIG. 3, a power amplifier 338 controlled by one or more gain settings may be used for transmitting packets at various power levels. Degradation of a transmitted signal may be a function of power amplifier 338 output power. As the power amplifier 338 is driven harder, there is often more distortion (e.g., a higher EVM). Various data rates used in IEEE 802.11x systems have different EVM requirements. It is desirable to transmit each data rate at the highest output power that provides the required EVM for successful demodulation at a receiver. As such, the transmit output power is controlled to ensure that a required EVM is met. Additionally, power amplifier 338 transmission should satisfy emission mask requirements. The power amplifier 338 out-of-band emissions are also a function of the output power. In some cases transmit power from the power amplifier 338 may be limited to meet emission mask requirements.

Closed Loop Power Control

To mitigate the variation of power amplifier 338 output power over process and temperature, a wireless device 200 that implements wireless LAN functionality may include support for a closed-loop transmission power control (CLPC) scheme. As shown in FIG. 3, an integrated circuit 312 may be mounted to a printed circuit board 314 that may, for example, be in the wireless device 200 described in FIG. 2 having wireless LAN networking capability. Closed loop power control feedback may be provided via a coupler 330 from the power amplifier output 318 to a transmit power sensor 320. The transmit power sensor 320 may be a high power detector (HDET) or other type of power detector configured to produce an output dependent on the strength of a signal received from the coupler 330. The output of the transmit power sensor 320 may be connected to an analog-to-digital converter (ADC) 322*b*. The ADC 322*b* output may be sent to a power look-up-table (LUT) in a transmit power control (TPC) module 324. The transmit power control module 324 may map the output of the ADC 322*b* to an actual power value, thus providing a measurement of the actual power level being output by the power amplifier 338 at that time. This power value may be used to adjust gain settings of the power amplifier 338 to maintain the desired power output.

The receive data path may include a receive low noise amplifier 325, a receive mixer 352, a receive base band filter 356, and an ADC 322*a*. The ADC 322*a* and the ADC 322*b* may be the same. The transmit data path may further include a transmit FIR module 340, a digital-to-analog converter 332, a transmit base band filter 328, and transmit mixer 334 along with a transmit DTOP module 336 for use in providing gain settings and transmitting packets.

Figure 4:
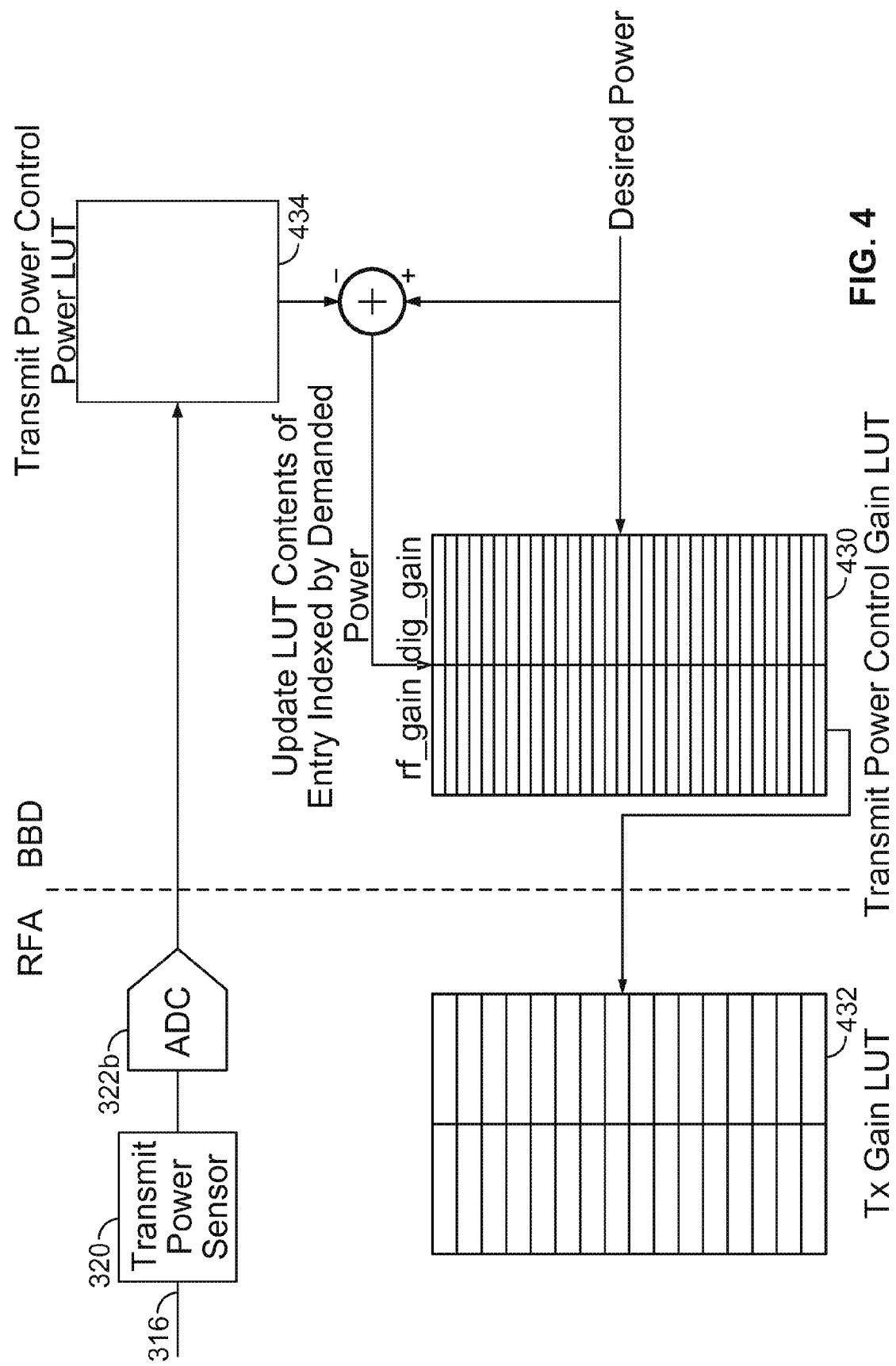
FIG. 4 shows a functional block diagram of exemplary components that may be used in conjunction with the components of FIG. 3 for use in a closed loop power control scheme.

FIG. 4 shows a functional block diagram of exemplary components that may be used in conjunction with the components of FIG. 3 for use in a closed loop power control scheme. The components and look-up tables shown in FIG. 4 may be included in the transmit power control module 324. According to one implementation, for closed loop power control, a desired output power for a current data rate may looked up by a media access control (MAC) layer in a look-up table (LUT) (not shown). This LUT maps data rates to the appropriate transmit power output levels for the power amplifier 338. Data packet transfer from the MAC to the physical (PHY) layer may then be initiated by the MAC layer. In some cases, the preamble of a transfer (e.g., a packet) may include the desired output power. The desired output power may be used as an index into a transmit power control gain LUT 430. As shown in FIG. 4, the transmit power control gain LUT 430 may have several entries, one for each of the possible values defined by data packet indicating the desired output power. The transmit power control gain LUT 430 may include radio frequency (RF) and digital gain settings that may be used to obtain the desired output power of the power amplifier 338.

RF gain settings may be sent across a gain command bus (not shown) to an RFA, and may be used as an index into a transmit gain LUT 432 that includes settings for the various RFA circuits to achieve the desired transmit output power. The transmit gain LUT 432 may include various entries, one for each of the possible RF gain settings defined by a RF gain entry of the transmit power control gain LUT 430.

A packet waveform may be generated by a baseband modulator (BBD) configured as defined by the settings retrieved from the gain LUTs 430 and 432. The packet waveform may then pass out the transmit chain through the power amplifier 338.

The power amplifier 338 output may then be provided via a coupler 330 back through a transmit power sensor 320 to an ADC 322*b*. The output of the ADC 322*b* is intended to provide a measurement of the current output power level of the power amplifier 338. However, the relationship between the output level of the transmit power sensor 320 and the actual power output level of the power amplifier 338 may be dependent on many factors related to, for example, the design and placement of the coupler 330 on the printed circuit board 214. To account for this variation, the output of the ADC 322*b* may be mapped to a value for actual power amplifier output through a calibration table shown as the transmit power control power LUT 434. The contents of this calibration table may correlate the transmit power sensor 320 output that corresponds to the actual power output of the power amplifier 338 amplifier output that produces the measured transmit power sensor 320 output.

Once the output of the receive ADC 322*b* is mapped to the actual output power via the transmit power control power LUT 434, the desired output power received from the MAC layer described above may be compared to the output of the transmit power control power LUT 434.

Based on this comparison, the contents of the gain entry in the transmit power control gain LUT 430 originally indexed by the desired output power may be updated. In this way, the gain entries in the transmit power control gain LUT 430 can be maintained accurate over time and correctly generate the desired power amplifier 338 output power.

The contents of the transmit gain LUT 432 may be designed to cover a range of desired output powers. The contents of the transmit gain LUT 432 may be programmable and the gain step size may be made any desired value. The transmit power control gain LUT 430 may be initialized to point to the transmit gain LUT 432 entries corresponding to the desired power range. The closed loop power control scheme may update the contents of the transmit power control gain LUT 430 to achieve the desired output power.

Calibrating the Feedback Path

The measured output power from the power sensor 320 should be as accurate as possible for the closed loop power control scheme to perform suitably. However, as described above, the output of the power sensor 320 may depend on various factors that may depend, for example, on the type and position of coupler 330 and inconsistencies as a result of manufacturing. For example, process variations when the integrated circuit 312 and coupler 330 are placed on the printed circuit board 314 of the final product may cause significant part-by part variation in the relationship between the actual power amplifier 338 output power and the transmit power sensor 320 output signal. Also, depending on the product the integrated circuit 312 is going to be incorporated in, different coupler designs and placements may be used. Due to these inconsistencies, the values output by the power sensor 320 may not always accurately reflect the actual output power. As such, the output of the power sensor 320 may need to be calibrated. As described above, the transmit power control power LUT 434 maps the output from the transmit power sensor 320 to the actual output of the power amplifier 338. The values for the transmit power control power LUT 434 may need to be derived by calibrating the response of the coupler 330 and transmit power sensor 320 for each device.

Conventionally, transmit power control power LUT 434 values may be determined on a part by part basis after the integrated circuit 312 is installed at manufacturing (e.g., installed on the printed circuit board 314 incorporated into the wireless device 200). The values for the transmit power control power LUT 434 may be determined by simultaneously making measurements of the power amplifier 338 output power level while also monitoring the output of ADC 322b. This may be accomplished by using external test equipment attached to the power amplifier 338 output line and sensing the transmit power sensor 320 output from the ADC 322b. These measurements may be made at several power amplifier 338 output power levels. The measurements may then be used to create the contents of the transmit power control power LUT 434 to map actual power amplifier 338 output power levels to corresponding transmit power sensor 320 output levels.

However, this method may be time consuming and inconvenient as it may be required to be performed on every wireless device being manufactured. Calibration for each device would require a process of generating the table using external test equipment for all power levels for each device and may increase the expense of the manufacturing process. This process also increases the risk of human error with the result that certain devices may experience poor performance where the cause of the problem may be difficult to detect. An integrated circuit 312 that requires less extensive and time consuming calibration for each device would desirable for OEMs that may have to perform the calibration processes when the integrated circuit 312 is installed on the printed circuit board 314. Implementations described herein are directed to systems that accurately derive values for use in the transmit power control power LUT 434 to provide actual output power levels of the power amplifier 338 based on the output of the ADC 322b and that may avoid testing each part with external test equipment.

According to one implementation, calibration on a per device basis may be avoided via an implementation for accurately calculating an average correlation between transmit power sensor 320 output and actual output power using tests run on a smaller subset of devices. For example, a sampling (e.g., 20 or 30) of final products may be tested, as will be further described below, to generate characteristic values for the relationship between actual power amplifier 338 output power and transmit power sensor 320 output (e.g., average or median values are determined). These values may be used as entries of the transmit power control power LUT 434 for all subsequently manufactured products.

Figure 5:
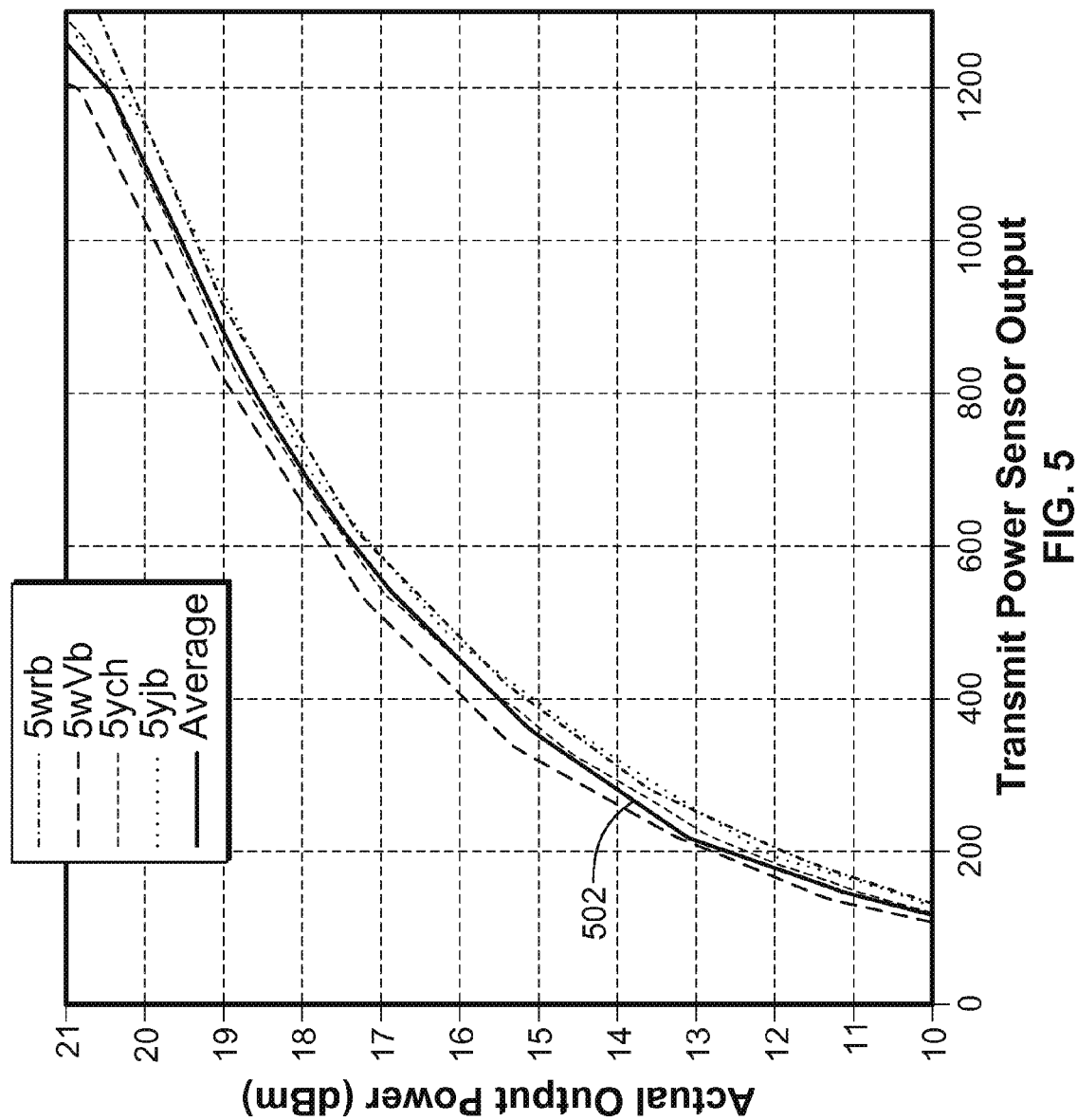
FIG. 5 is a plot showing the output of a transmit power sensor as a function of the actual transmit output power.

For this implementation, the transmit power sensor 320 response may be consistent from device to device for typical silicon at room temperature. As such, the transmit power sensor 320 response may be characterized over some quantity of parts, averaged, and then the averaged response could be applied to populate the transmit power control power LUT 434 for other devices. This avoids calibrating the transmit power sensor 320 for each device. FIG. 5 is a plot showing the output of a transmit power sensor 320 as a function of the actual transmit output power for four different assembled devices. The average is indicated by the curve 502. Values along the curve 502 would be used to for generating the transmit power control power LUT 434 entries for subsequent manufactured devices.

To utilize this technique, each different board design may be characterized. Characterization may be similar for calibrating on a per-part basis. This characterization may relate the power at a connector to the transmit power sensor 320 response. For each characterization, a waveform (e.g., OFDM) may be transmitted by a wireless device 200. The output power may then be measured at a connector. The output of the transmit power sensor 320 may then be read via the ADC 322b as described above. The data from these characterizations may then be collected and averaged to generate a reference transmit power control power LUT 434 as described above. Depending on the frequency dependence of the design, a transmit power control power LUT 434 may be generated for multiple channels. The reference transmit power control power LUT(s) 434 may be stored in memory (e.g., NVRAM) of each subsequent wireless devices when configuring the closed loop power control.

In some implementations, it may be possible to reduce the storage requirements in memory by storing a subset of the data points and interpolating the data prior to programming the transmit power control power LUT 434 in the wireless device 200. Additionally, it may be that any frequency dependence can be accounted for by simply shifting the transmit power control power LUT 434 values characterized in one channel and using it for another channel. In this manner, the storage requirements may be reduced by storing one set of transmit power control power LUT 434 data and the relative shifts that are applicable for each channel.

To do this, the wireless device 200 may read back the transmit power control power LUT 434 information from memory, interpolate the data if necessary, write transmit power control power LUT 434 information to the transmit power control 324 memory, program the ADC offset value in the transmit power control 324, and enable closed loop power control.

Figure 6:
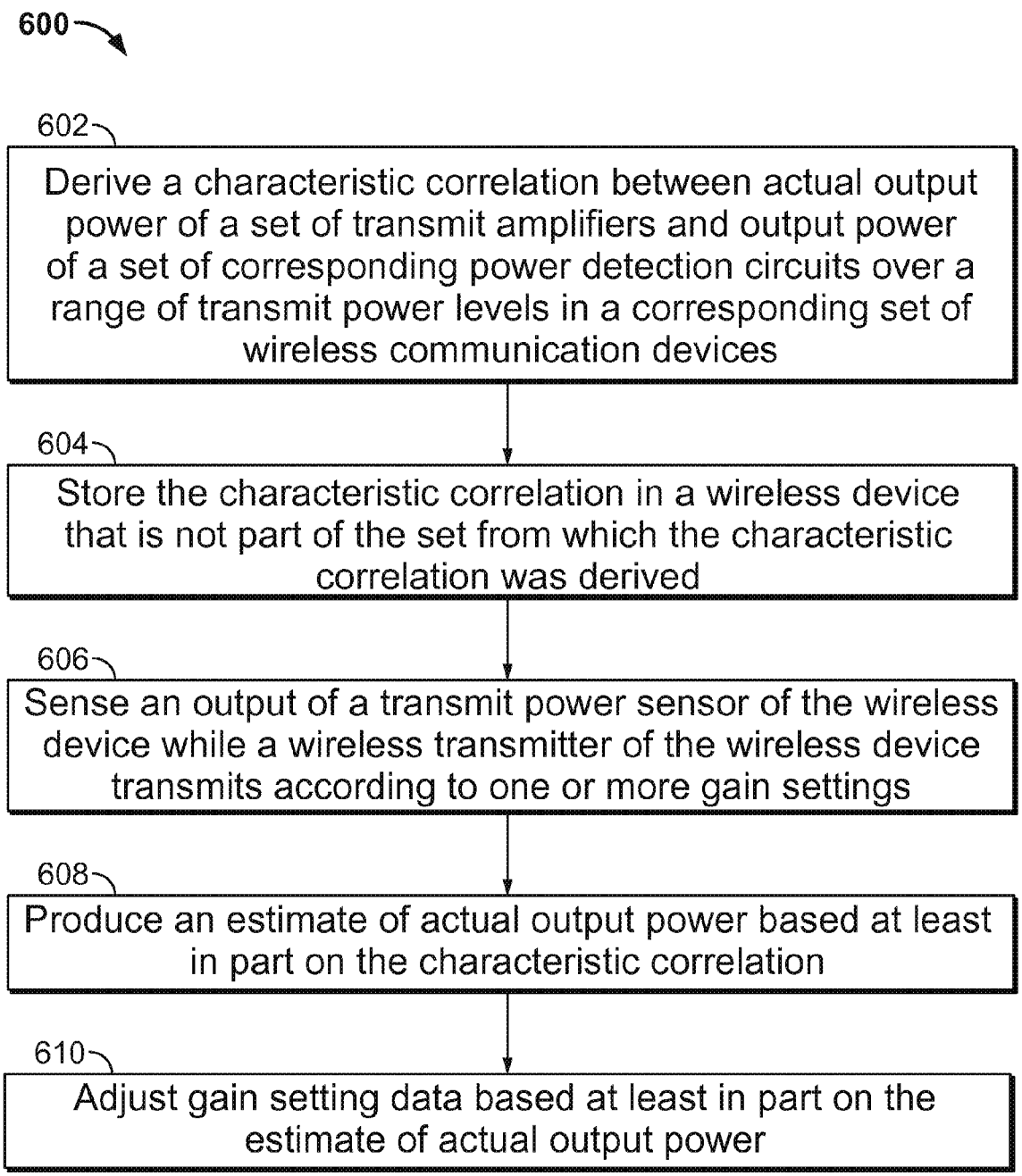
FIG. 6 shows a flow chart of an exemplary method for correlating an output of a transmit power sensor with actual power output of a wireless transmitter.

FIG. 6 shows a flow chart of an exemplary method for correlating an output of a transmit power sensor 320 with actual power output of a wireless transmitter 210. In block 602, a characteristic correlation between actual output power of a set of transmit amplifiers and output power of a set of corresponding power detection circuits may be derived over a range of transmit power levels for a corresponding set of wireless communication devices. As described above, this may correspond to transmitting a waveform (e.g., OFDM) for each power level for each of the devices tested to measure the output of the power sensor 320. In block 604, the characteristic correlation may be stored in a wireless device 200 that is not part of the set from which the characteristic correlation was derived. The correlation may be stored as part of the transmit power control power LUT 434 as described above. As the stored correlation may provide accurate measurements of actual output power of the wireless device 200, calibration is not needed for the wireless device 200. This avoids the time and challenges that may result from calibration for each device.

In block 606, the wireless device 200 may thereafter sense an output of a transmit power sensor 320 of the wireless device 200 while the wireless transmitter 210 of the wireless device 200 transmits according to one or more gain settings. In block 608, the wireless device 200 may produce an estimate of actual output power based at least in part on the stored characteristic correlation. In block 610, gain setting data may be adjusted based at least in part on the estimate of actual output power.

Figure 7:
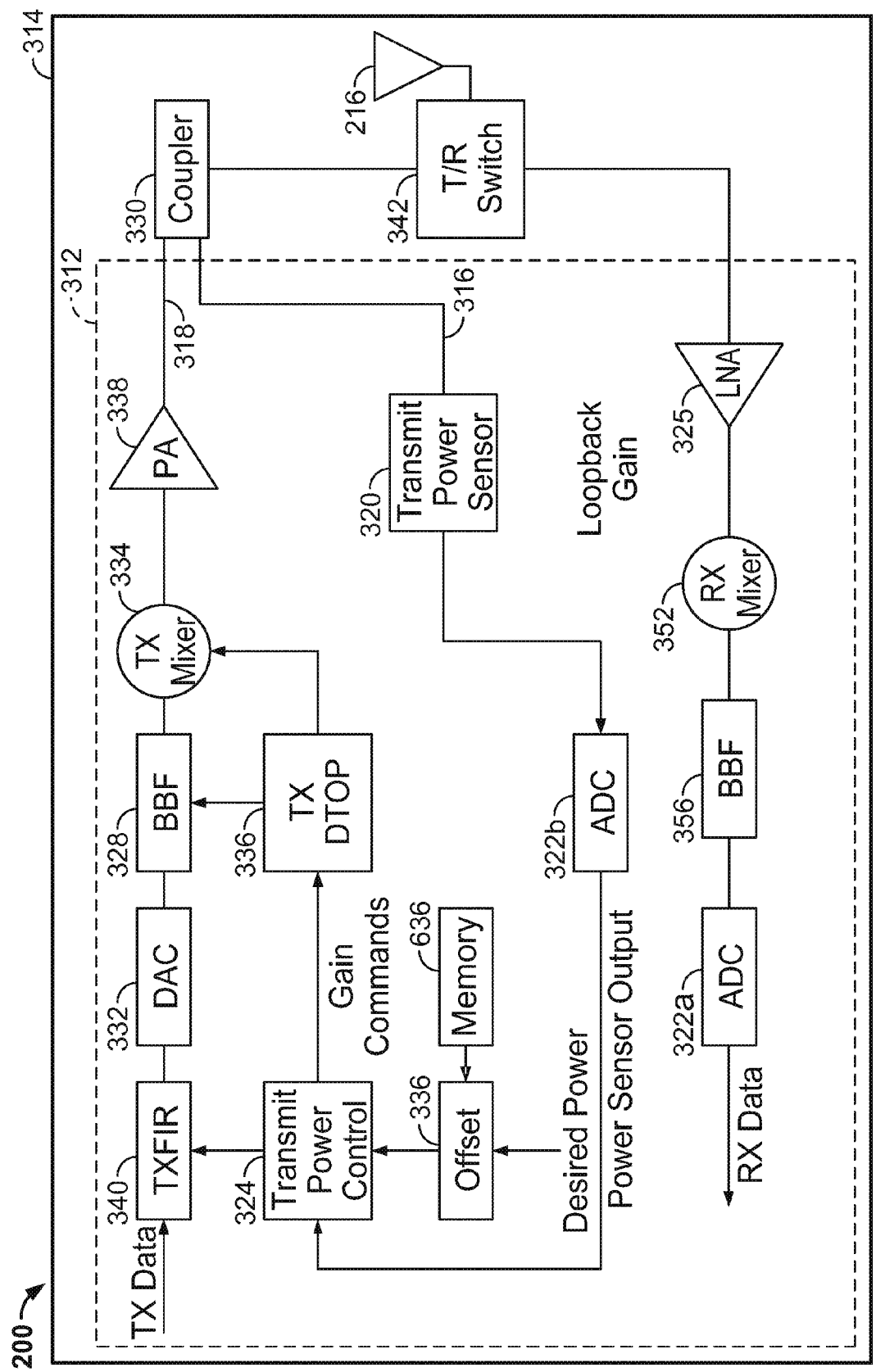
FIG. 7 shows a functional block diagram of FIG. 4 with additional components for computing and using desired power offsets.

In addition, in one implementation, an offset to the desired (or "commanded") power may be provided. FIG. 7 shows a functional block diagram of FIG. 4 with additional components for computing and using desired power offsets. More specifically, the desired power from the MAC layer may be adjusted by an offset module 336 that may obtain specific offset values from a memory 636. In some implementations, signal quality measurements may be used to determine whether there is a need to offset and by how much. One signal quality measurement that may be used is a measure of the transmit error vector magnitude (EVM). The measured transmit EVM may provide an accurate indication of whether an offset is needed to ensure the closed loop power control scheme functions properly. For example, once the transmit power control LUT 434 has been populated, for example, by using the implementations as described above, the transmit EVM may be measured at a relatively high gain. If the measured EVM is indicates a high level of signal distortion, the desired power may be offset.

Figure 8:
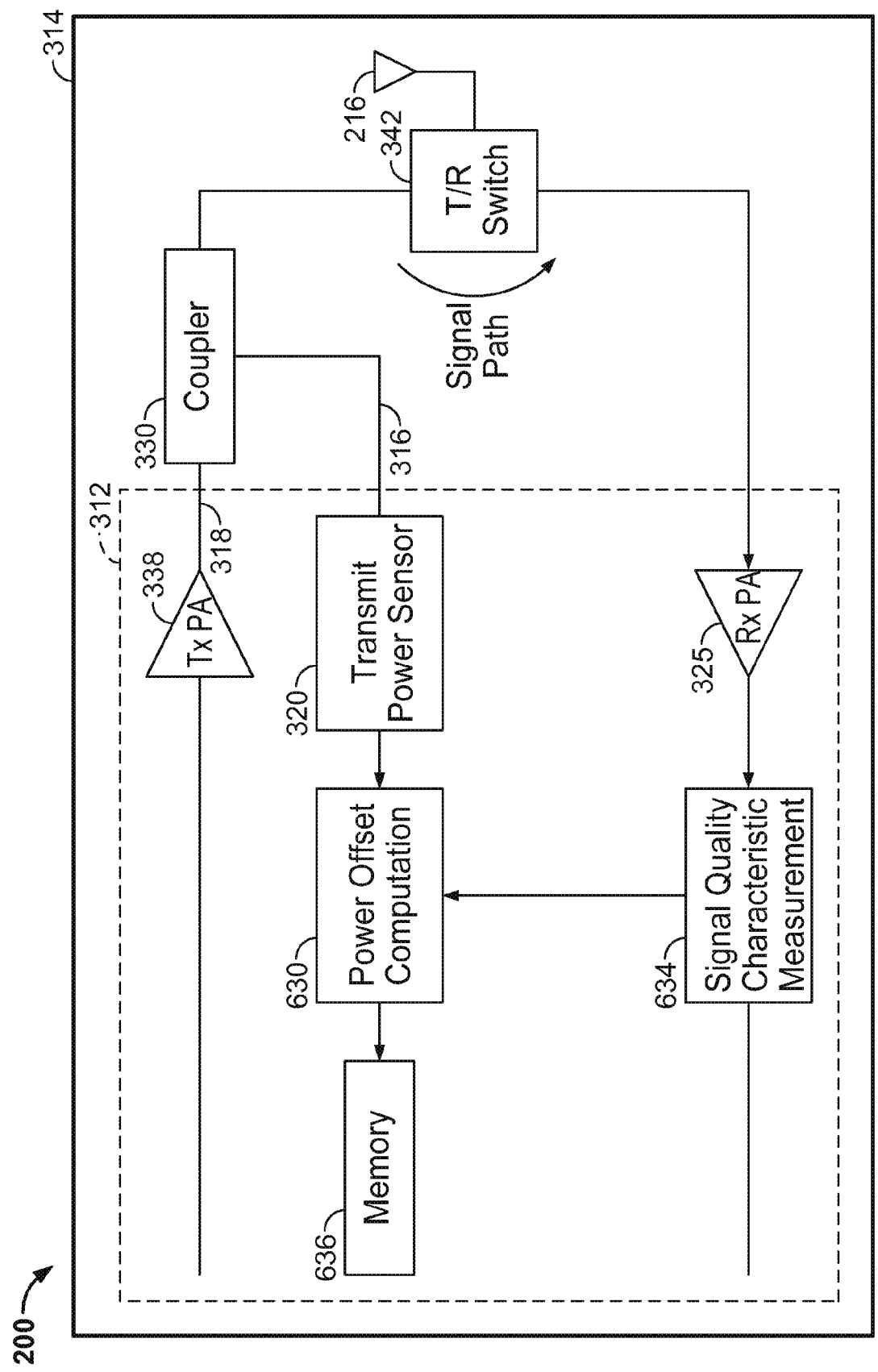
FIG. 8 shows a functional block diagram of exemplary components that may be used to calculate desired power offsets using signal quality characteristic measurements in conjunction with the components of FIG. 7.

FIG. 8 shows a functional block diagram of exemplary components that may be used to calculate desired power offsets using signal quality characteristic measurements in conjunction with the components of FIG. 7. Once the transmit power control LUT 434 is populated, the wireless device 200 may be configured to begin transmitting packets at a particularly chosen power level (e.g., 19.5 dBm). The wireless device 200 may thereafter start transmitting short packets at the chosen power level to converge the closed loop power control. A "loopback" mode may be enabled that allows for measuring signal quality characteristics of the power output from the power amplifier 338 while transmitting the test signals. This may be accomplished via a signal path that allows a portion of the signal output from the amplifier 338 to pass into the receive data path using reverse isolation of the T/R Switch 342. A signal quality characteristic module 634 may be included in the receive data path that is able to measure a signal quality characteristic (e.g., EVM) of the portion of the signal output from the output of the power amplifier 338. Measurements from the signal quality characteristic measurement module 634 along with the output values form the transmit power sensor 320 may be provided to a power offset computation module 630. An offset computed based on the measurements may be stored in a memory 636. As shown in FIG. 7, the offsets in the memory 636 may be used by an offset module 336 to offset the desired power to account for any inaccuracies created by the averaged correlation stored in the transmit power control LUT 434 or other inaccuracies of the closed loop power control scheme. These operations may be performed internally on each device and thus no external test equipment or manual process may be needed to compute the offset.

According to another implementation, the transmit power sensor 320 output may be calibrated to a measure of actual power amplifier 338 output power by relying on EVM measurements. This implementation may avoid any need for a manufacture to perform characterization through tests using external test equipment. Rather, all calibration may be internal to and controlled by the wireless device 200 and may require no intervention by the device manufacturer. With reference to FIG. 7, the measured transmit EVM may be correlated to actual power amplifier 338 output power using output power to EVM data collected during bench characterization before the integrated circuit 312 is installed on the printed circuit board 314. The transmit power sensor 320 output and the transmit EVM may both be measured during transmission at a given power level at various gain settings. For the EVM measurement, the transmit signal may be looped back to the receive path using the reverse isolation of the T/R switch 342 to attenuate the power amplifier 338 output prior to entering the low noise amplifier (LNA) 25 on the receiver side as described above. The receive path can include processing circuitry configured (as a hardware configuration, software configuration, or both) to measure EVM during the transmission.

In this way, transmit power sensor 320 output and actual power amplifier 338 power output can be correlated. This data may be used to populate the transmit power control power LUT 434 without attaching test equipment to the power amplifier 338 output. The transmit power control power LUT 434 may be populated individually for each product being manufactured by using an automated calibration process. It should be appreciated that EVM is not the only signal quality characteristic that may be used in this procedure. For example, other signal quality characteristics such as spectral emissions, or other parameters that change in a defined manner with changes in transmitter output power could be used as a substitute for EVM in this procedure.

Figure 9:
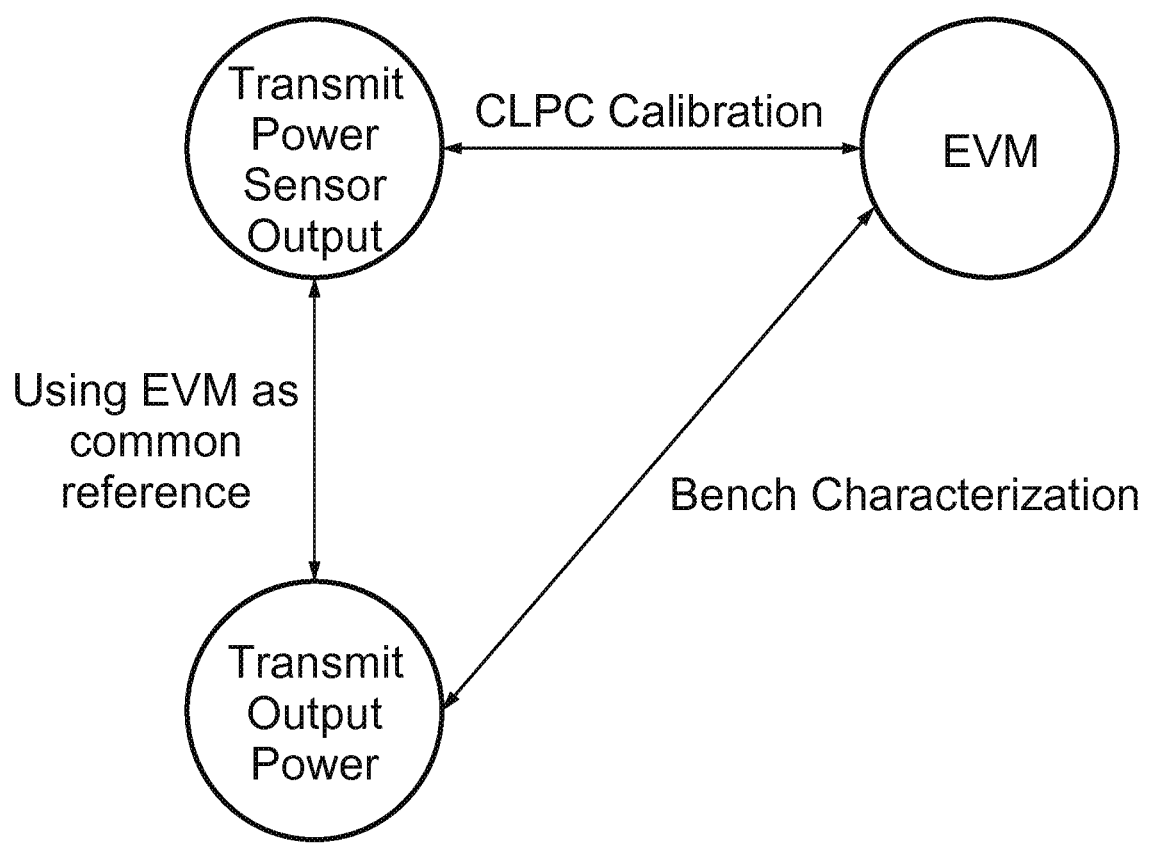
FIG. 9 shows a chart demonstrating how the output of a transmit power sensor may be related to actual transmit output power using error vector magnitude (EVM) as a common reference.

FIG. 9 shows a chart demonstrating how the output of a transmit power sensor 320 may be related to actual transmit output power using error vector magnitude (EVM) as a common reference. As shown in FIG. 9, during bench characterization, EVM can be related to actual transmit output power. Once the integrated circuit 312 has been installed on the printed circuit board 314, EVM of the signal may be measured and used for closed loop power control calibration of the transmit power sensor 320. As such, the transmit power sensor 320 output may be correlated to the actual transmit power output using EVM as a common reference.

Figure 10:
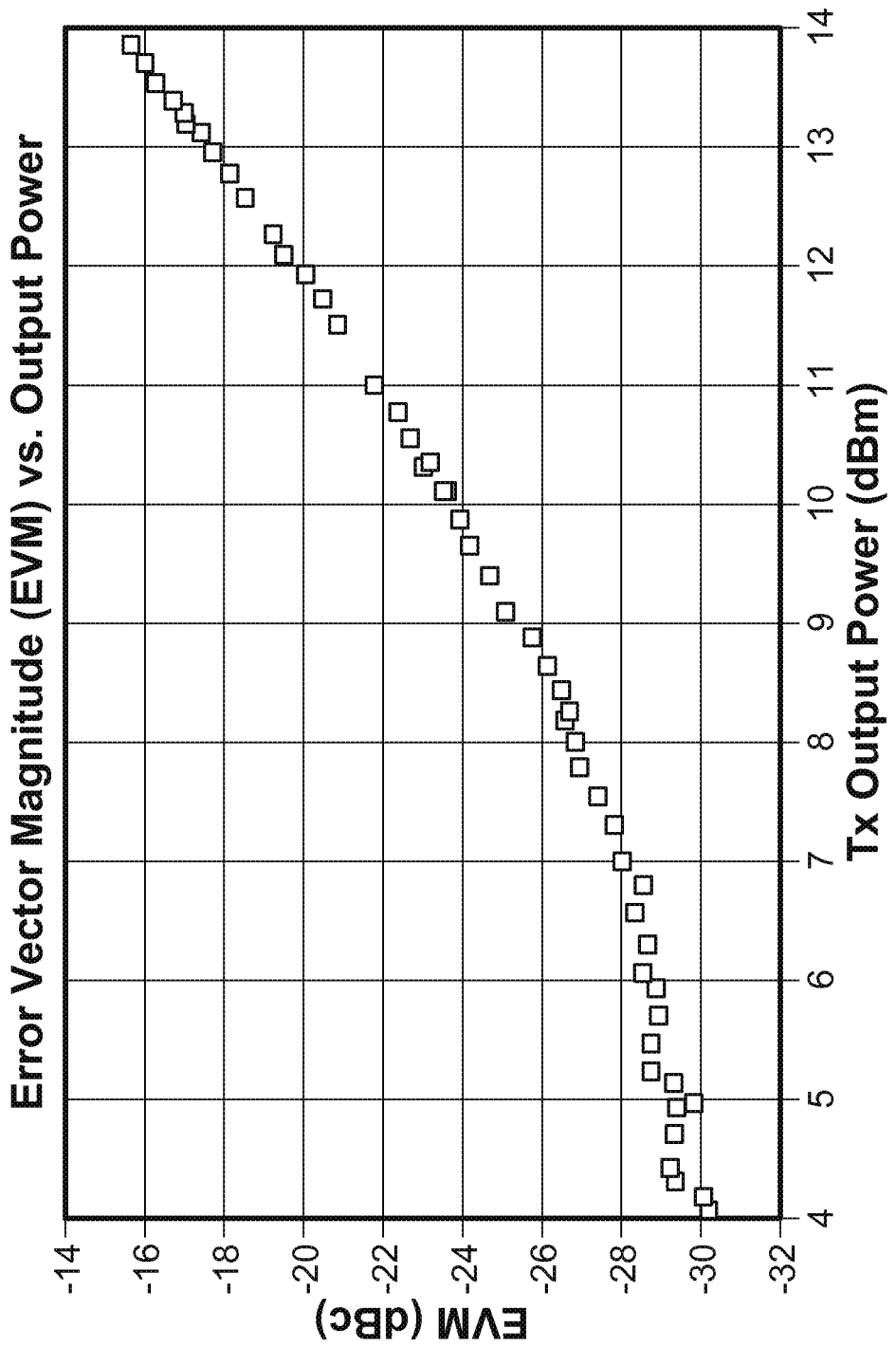
FIG. 10 is a plot showing transmit output power of a signal as a function of the EVM of the signal.

FIG. 10 is a plot showing transmit output power of a signal as a function of the EVM of the signal that may be used to correlate actual transmit power output with the output of a transmit power sensor 320. As described above, this data may be generated during bench characterization of the integrated circuit. Once the integrated circuit 312 has been installed on the printed circuit board 314, these data points may be used to determined actual power output power levels when measuring EVM. Knowledge of the actual transmit power output level allows comparison to the power output level detected by a transmit power sensor 320. This comparison may be used to populate the transmit power control power LUT 343 for generating accurate power output values for the closed loop power control scheme.

Figure 11:
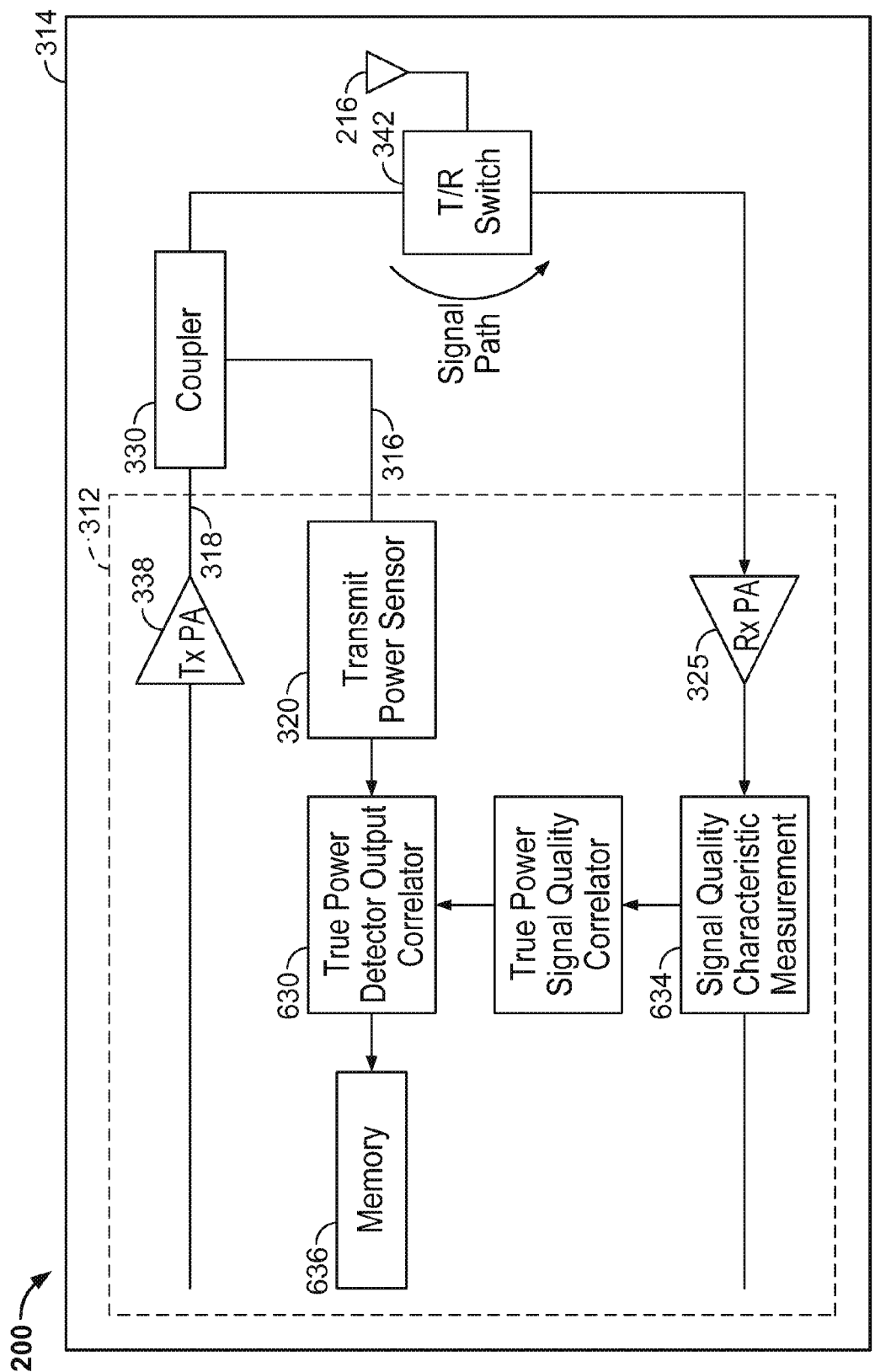
FIG. 11 shows a functional block diagram of exemplary components that may be used to calibrate the output of a transmit power sensor using EVM measurements in conjunction with the components of FIGS. 3 and 4.

FIG. 11 shows a functional block diagram of exemplary components that may be used to calibrate the output of a transmit power sensor 320 using EVM measurements in conjunction with the components of FIGS. 3 and 4. Once an integrated circuit 312 is installed onto a printed circuit board 314 of a wireless device 200, a coupler 330 may be installed on the printed circuit board 314 to couple the output 318 from the power amplifier 338 to the transmit power sensor 320. The transmit power sensor 320 may then be calibrated via the transmit power control power LUT 434 to provide actual output power values. In addition to the components shown in FIG. 3, the integrated circuit 312 may include a signal quality characteristic module 634 which measures a signal quality characteristics such as EVM of a signal output from a receive amplifier 325 in a receive data path. The integrated circuit 312 may further include a true power signal quality correlator module 632 which may use data gathered from a bench characterization to determine actual output power based on measured signal quality characteristics. The true power signal quality correlator 632 may include a memory (not shown) with a LUT. The integrated circuit 312 may further include a true power detector output correlator 630 that maps an output of a transmit power sensor 320 (via an ADC 322b as described above) to actual power using data received from the true power signal quality correlator 632. Information derived in the true power detector output correlator 630 may be stored in a memory 636. The memory 636 may include or be the transmit power control power LUT 434, or the data in memory 636 may be transferred with or without some processing to the TPC Power LUT 434.

Figure 12:
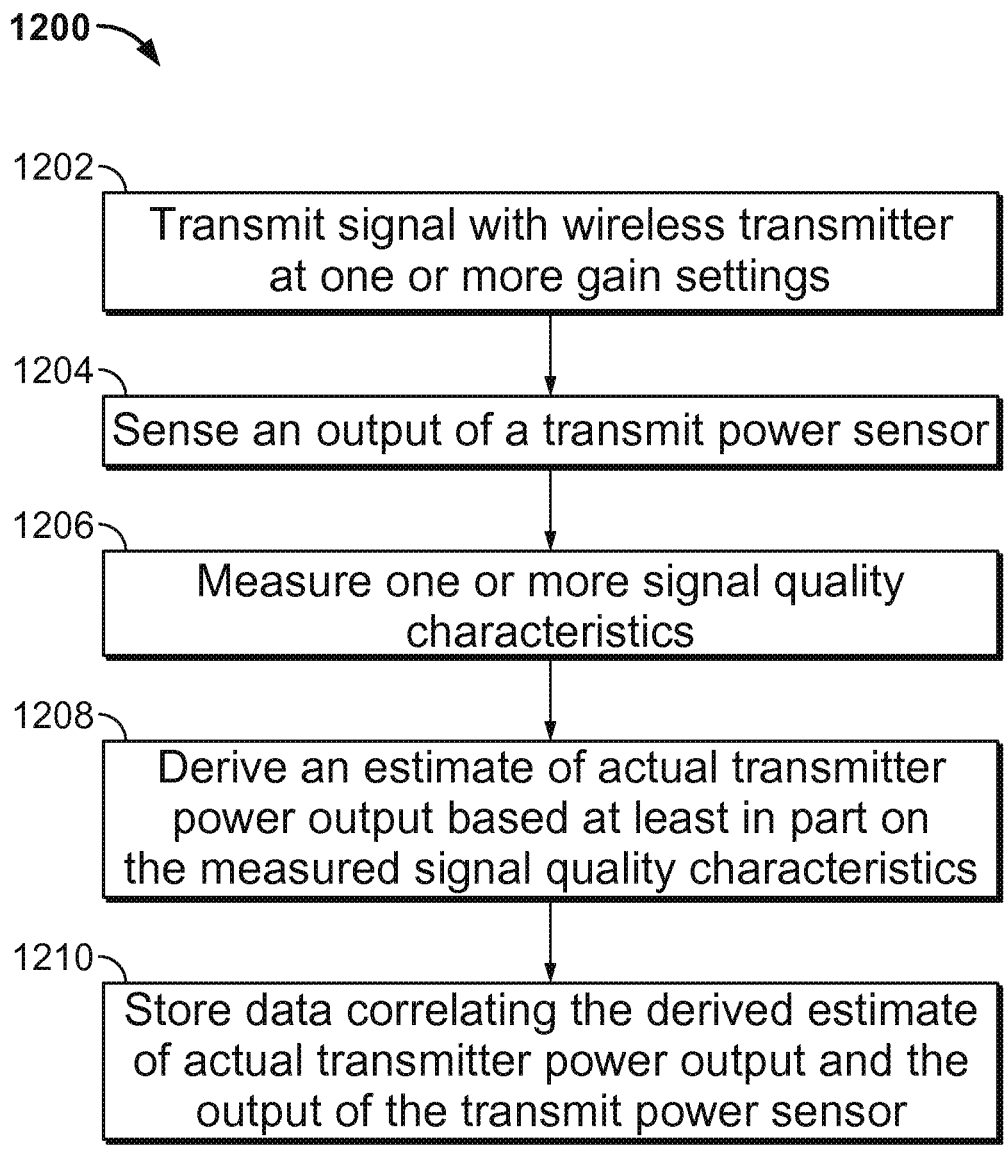
FIG. 12 shows a flow chart of another exemplary method for correlating an output of a transmit power sensor with actual power output of a wireless transmitter.

FIG. 12 shows a flow chart of an exemplary method for correlating an output of a transmit power sensor 320 with actual power output of a wireless transmitter 210 with reference to the components of FIGS. 3, 4 and 11. Once the integrated circuit 312 is integrated into a printed circuit board 314 with the coupler 330, the wireless device 200 may be enabled to transmit and receive packets. In block 1202, signals (e.g., for transmitting the packets) may be transmitted via the power amplifier 338 at one or more gain settings. The gain settings may be determined by requirements of a packet configured to be used for calibration. In block 1204, a transmit power sensor 320 may sense an output power of the signal received via the coupler 330. For example, the transmit power sensor 320 output may be read from a transmit power control register. In block 1202, signal quality characteristics of the signal being transmitted may be measured/determined. For example, EVM of the signal may be measured by a signal quality characteristic measurement module 634.

In block 1208, a true power signal quality correlator module 632 may derive an estimate of actual transmitter power output based at least in part on the measured signal quality characteristic. For example, the true power signal quality correlator module 632 may determine actual power output from power amplifier 338 from a previously determined stored correlation between power amplifier 338 output power and EVM values as described above and shown in FIG. 10. In block 1210, a true power detector output correlator module 530 may compare transmit power sensor 320 output values to values from the true power signal quality correlator 632 which represent the actual output power for the signal at the one or more gain settings. The true power detector output correlator module 530 may then store data correlating the derived estimate of actual transmitter power output and the output of the transmit power sensor 320 in a memory 636 based on the comparison. This data may be stored in the transmit power control power LUT 434 as described above with reference to FIG. 4. Power sensor measurements may then be enabled again and the calibration may be repeated for all transmit gain settings for which calibration is desired.

The calibration described with reference to FIG. 12 may be performed during an initial start-up process executed when a device is initially powered on. In some cases the calibration may only performed once for a wireless device 200. In other cases, the calibration may be performed each time the wireless device 200 is powered on in case actual output power changes over the lifetime of a product.

According to the system and method described above, EVM may be correlated to actual output power over a larger range of output powers. This data is then used to calibrate the transmit power sensor 320 so as to populate the transmit power control power LUT 434 to map transmit power sensor 320 readings to actual power output of the power amplifier 338 over a large range of output powers. Providing accurate readings over a range of output powers may provide several benefits. In one aspect, the wireless device 200 may be configured to transmit packets using different wireless protocols with a variety of different power level requirements that may vary from packet to packet. As such, accurate calibration using a range of outputs powers may provide for accurate power control for any output power that may be used to for different types of signals and power output requirements. Furthermore, developing an actual correlation between and EVM output power at the bench characterization phase avoids performing any testing during manufacturing using external test equipments for calibrating the transmit power sensor 320.

If implemented in software, the functions may be stored on or transmitted over as one or more instructions or code on a computer-readable medium. The steps of a method or algorithm disclosed herein may be implemented in a processor-executable software module that may reside on a computer-readable medium. Computer-readable media includes both computer storage media and communication media including any medium that may be enabled to transfer a computer program from one place to another. A storage media may be any available media that may be accessed by a computer. By way of example, and not limitation, such computer-readable media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection may be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium that may be incorporated into a computer program product.

It should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may include one or more elements.

A person/one having ordinary skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

A person/one having ordinary skill in the art would further appreciate that any of the various illustrative logical/functional blocks, modules, processors, means, circuits, and algorithm steps described in connection with the aspects disclosed herein may be implemented as electronic hardware (e.g., a digital implementation, an analog implementation, or a combination of the two, that may be designed using source coding or some other technique), various forms of program or design code incorporating instructions (that may be referred to herein, for convenience, as "software" or a "software module"), or combinations of both. To clearly illustrate this interchangeability of hardware and software, various illustrative components, blocks, modules, circuits, and steps have been described above generally in terms of their functionality. Whether such functionality is implemented as hardware or software using various processing circuitry depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein and in connection with FIGS. 1-13 may be implemented within or performed by an integrated circuit (IC), an access terminal, or an access point. The IC may include a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. The logical blocks, modules, and circuits may include antennas and/or transceivers to communicate with various components within the network or within the device. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such implementation. The functionality of the modules may be implemented in some other manner as taught herein. The functionality described herein (e.g., with regard to one or more of the accompanying figures) may correspond in some aspects to similarly designated "means for" functionality in the appended claims.

It is understood that any specific order or hierarchy of steps in any disclosed process is an example of a sample approach. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

Certain features that are described in this specification in the context of separate implementations also may be implemented in combination in a single implementation. Conversely, various features that are described in the context of a single implementation also may be implemented in multiple implementations separately or in any suitable sub-combination. Moreover, although features may be described above as acting in certain combinations and even initially claimed as such, one or more features from a claimed combination may in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems may generally be integrated together in a single software product or packaged into multiple software products. Additionally, other implementations are within the scope of the following claims. In some cases, the actions recited in the claims may be performed in a different order and still achieve desirable results.

What is claimed is:

1. A method of correlating an output of a transmit power sensor with actual output power of a wireless transmitter, the method comprising:
    deriving a characteristic correlation between an actual output power of a set of transmit amplifiers and an output power and of a set of corresponding power detection circuits over a range of transmit power levels in a corresponding set of wireless communication devices;
    storing the characteristic correlation in a wireless device that is not part of the set from which the characteristic correlation was derived;
    sensing an output of a transmit power sensor of the wireless device while the wireless transmitter of the wireless device transmits according to one or more gain settings;
    producing an estimate of actual output power based at least in part on the characteristic correlation; and
    adjusting gain setting data based at least in part on the estimate of actual output power.

2. The method of claim 1, wherein the deriving is performed after the set of transmit amplifiers located on a set of corresponding first substrates are coupled via a set of corresponding coupler elements to a set of corresponding antennas located on a set of corresponding second substrates.

3. The method of claim 1, wherein deriving the characteristic correlation comprises averaging a correlation between the actual output power of each of the set of transmit amplifiers and each of the set of corresponding power detection circuits.

4. The method of claim 1, wherein adjusting comprises adjusting gain setting data based on a comparison between the estimate of actual output power and a desired output power.

5. The method of claim 4, further comprising deriving an offset value to offset the desired output power based on a measurement of signal quality characteristic values of a transmitted signal.

6. The method of claim 5, wherein the signal quality characteristic values comprise error vector magnitude (EVM) values.

7. The method of claim 4, further comprising determining a type of data signal being transmitted and determining an offset of the desired output power based on the type of data signal.

8. The method of claim 1, further comprising determining a channel being used while the wireless transmitter of the wireless device transmits and determining offsets value for the characteristic correlation based on the channel.

9. A wireless communication apparatus comprising:
a transceiver;
a memory having stored therein a characteristic correlation between an actual output power of a set of transmit amplifiers and an output power and of a set of corresponding power detection circuits over a range of transmit power levels in a corresponding set of wireless communication devices;
processing circuitry configured to sense an output of a transmit power sensor of the transceiver while the transceiver transmits according to one or more first gain settings;
processing circuitry configured to produce an estimate of actual output power based at least in part on the characteristic correlation; and
processing circuitry configured to adjust gain setting data based at least in part on the estimate of actual output power.

10. The wireless communication apparatus of claim 9, wherein the characteristic correlation is derived after the set of transmit amplifiers located on a set of corresponding first substrates are coupled via a set of corresponding coupler elements to a set of corresponding antennas located on a set of corresponding second substrates.

11. The wireless communication apparatus of claim 9, wherein the characteristic correlation is based on an average of a correlation between the actual output power of each of the set of transmit amplifiers and each of the set of corresponding power detection circuits.

12. The wireless communication apparatus of claim 9, wherein the processing circuitry is configured to adjust gain setting data based on a comparison between the estimate of actual output power and a desired output power.

13. The wireless communication apparatus of claim 12, further comprising processing circuitry configured to derive an offset value to offset the desired output power based on a measurement of signal quality characteristic values of a transmitted signal.

14. The wireless communication apparatus of claim 13, wherein the signal quality characteristic values comprise error vector magnitude (EVM) values.

15. The wireless communication apparatus of claim 12, further comprising processing circuitry configured to determine a type of data signal being transmitted and processing circuitry configured to determine an offset of the desired output power based on the type of data signal.

16. The wireless communication apparatus of claim 9, further comprising processing circuitry configured to determine a channel being used while the transceiver transmits and processing circuitry configured to determine offsets value for the characteristic correlation based on the channel.

17. A method of correlating an output of a transmit power sensor with actual output power of a wireless transmitter, the method comprising:
transmitting a signal with the wireless transmitter according to one or more first gain settings of one or more amplifiers in the wireless transmitter;
sensing an output of the transmit power sensor while the wireless transmitter transmits according to the one or more first gain settings;
measuring one or more signal quality characteristics of the transmitted signal at the one or more first gain settings;
deriving an estimate of actual output power at the one or more first gain settings, wherein the deriving is based at least in part on the one or more signal quality characteristics; and
storing data correlating the estimate of actual output power to the output of the transmit power sensor at the one or more first gain settings.

18. The method of claim 17, comprising repeating the transmitting, sensing, measuring, deriving, and storing at one or more second gain settings.

19. The method of claim 17, wherein at least one of the one or more signal quality characteristics include an error vector magnitude (EVM).

20. The method of claim 17, wherein the deriving is further based on a stored correlation between the actual output power values and signal quality characteristic values, the signal quality characteristic values corresponding to the one or more signal quality characteristics.

21. A transceiver apparatus comprising:
one or more transmit amplifiers configured to output a signal according to one or more first gain settings;
a detector configured to produce an output dependent on a transmit output power level of the one or more transmit amplifiers;
processing circuitry configured to measure one or more signal quality characteristics of the signal output by the one or more transmit amplifiers;
processing circuitry configured to derive an estimate of actual output power by the one or more transmit amplifiers based at least in part on the one or more signal quality characteristics; and
processing circuitry configured to store data correlating the estimate of actual output power with the output of the detector.

22. The transceiver apparatus of claim 21, comprising processing circuitry configured to use the data correlating the estimate of actual output power with the detector output to select gain settings for the one or more transmit amplifiers.

23. The transceiver apparatus of claim 21, wherein at least one of the one or more signal quality characteristics include an error vector magnitude (EVM).

24. The transceiver apparatus of claim 21, wherein the processing circuitry configured to derive an estimate of actual power is further configured to derive the estimate of actual power based on a stored correlation between the actual output power values and signal quality characteristic values, the signal quality characteristic values corresponding to the one or more signal quality characteristics.

25. A transceiver apparatus, comprising:
means for transmitting a signal according to one or more first gain settings of one or more amplifiers of the means for transmitting the signal;
means for sensing transmit power while the means for transmitting transmits according to the one or more first gain settings;
means for measuring one or more signal quality characteristics of the transmitted signal at the one or more first gain settings;
means for deriving an estimate of actual output power at the one or more first gain settings, wherein the deriving is based at least in part on the one or more signal quality characteristics; and means for storing data correlating the estimate of actual output power to the output of the transmit power sensor at the one or more first gain settings.

26. The transceiver apparatus of claim 25, wherein at least one of the one or more signal quality characteristics include an error vector magnitude (EVM).

27. The transceiver apparatus of claim 25, wherein the means for deriving is configured to further derive the estimate of actual power based on a stored correlation between the actual output power values and signal quality characteristic values, the signal quality characteristic values corresponding to the one or more signal quality characteristics.

\* \* \* \* \*